(12) United States Patent
Mulder et al.

(10) Patent No.: US 6,392,478 B1
(45) Date of Patent: May 21, 2002

(54) AMPLIFICATION DEVICE HAVING AN ADJUSTABLE BANDWIDTH

(75) Inventors: Jan Mulder; Marcel Louis Lugthart, both of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/713,864

(22) Filed: Nov. 16, 2000

(30) Foreign Application Priority Data

Nov. 23, 1999 (FR) ............................................. 9914745

(51) Int. Cl.$^7$ ................................................ H03F 1/36
(52) U.S. Cl. .................... 330/86; 330/103; 330/282; 330/107; 330/109
(58) Field of Search ................... 330/86, 103, 107, 330/109, 282

(56) References Cited

U.S. PATENT DOCUMENTS

| 3,752,928 A | * | 8/1973 | Flickinger | .................... 330/109 |
| 3,842,362 A | * | 10/1974 | Dimon | .......................... 330/85 |
| 4,055,813 A | * | 10/1977 | French | ......................... 330/103 |
| 4,114,115 A | * | 9/1978 | Minnis | .......................... 330/86 |
| 4,354,159 A | * | 10/1982 | Schorr et al. | .................. 330/86 |

FOREIGN PATENT DOCUMENTS

JP          56-164609        * 12/1981

OTHER PUBLICATIONS

"Analysis and Design of Analog Intergrated Circuits" by Gray and Meyer, Chapter 8, pp. 535–596.

* cited by examiner

*Primary Examiner*—Michael B Shingleton
(74) *Attorney, Agent, or Firm*—Steven R. Biren

(57) ABSTRACT

The invention relates to a device for amplifying electronic signals, including:
   an amplifier PRA, and
   a plurality of feedback loops G1, G2 placed between the output and the input of the amplifier, which feedback loops are arranged so that each feedback loop has an adjustable gain and all the feedback loops jointly form an assembly having an equivalent impedance which is substantially independent of the gain settings selected.

Thanks to the invention, the amplification bandwidth can be easily adjusted without adversely affecting the performance of the device in terms of noise and high cut-off frequency.

6 Claims, 1 Drawing Sheet

AMPLIFICATION DEVICE HAVING AN ADJUSTABLE BANDWIDTH

BACKGROUND OF THE INVENTION

The invention relates to a device for amplifying electronic signals, comprising:

an amplifier having an input and an output, and a feedback loop arranged between the output and the input of the amplifier.

Such devices are commonly used in the electronics industry to amplify, inter alia, audio signals, video signals or data signals originating from read heads of hard disks. The theory regarding this type of devices is described in chapter 8 of the book entitled "Analysis and Design of Analog Integrated Circuits" by Messrs. Gray and Meyer. This book describes the advantages of the feedback loop, which enables, in particular, to stabilize the gain of the amplification device, adapt the input and output impedance of the device, linearize the amplification performed by the device, and increase the amplification bandwidth.

For some applications, it is desirable to enable the user of the amplification device to control the parameters that define the amplification bandwidth, and in particular to make the low cut-off frequency of the amplification device adjustable.

In principle, such a control requires a modification of the arrangement of the amplifier itself, or a modification of the arrangement of the feedback loop. However, these two options have a harmful effect on the proper functioning of the device. The elements forming the amplifier are in principle dimensioned so as to produce as little noise as possible during operation. A modification of the elements of which the amplifier is composed would cause the amplifier to produce more noise, which is to be proscribed. In addition, the elements forming the amplifier and the feedback loop, in principle, are dimensioned in such a way that the input impedance of the amplification device is adapted to the impedance of an element, which is arranged upstream of the device and is intended to supply the signal to be amplified to the amplification device. This applies, in particular, when the signals to be amplified originate from a read head of a hard disk via a flexible lead, in which case the transfer rate of data, and hence the frequency of the signals to be amplified, are very high. A modification of the elements forming the amplifier itself or the feedback loop would cause the impedance adaptation to be disturbed and hence result in a reduction of the high cut-off frequency of the amplification device, which is also to be proscribed.

SUMMARY OF THE INVENTION

It is an object of the invention to overcome these drawbacks by providing an amplification device wherein the bandwidth of the amplification can be easily adjusted without the performance of the device being adversely effected in terms of noise and high cut-off frequency.

In accordance with the invention, an amplification device in accordance with the opening paragraph comprises a plurality of feedback loops, which are placed between the output and the input of the amplifier, which feedback loops are each arranged so that each feedback loop has an adjustable gain and all the feedback loops jointly form an assembly having an equivalent impedance, which is substantially independent of the gain settings selected.

In this device, it is possible to modify the arrangement of the feedback loops without causing a change in the equivalent impedance of the amplification device, viewed from the input of the device. It is thus possible to modify the amplification bandwidth, more particularly the low cut-off frequency of said band, without disturbing the impedance adaptation effected by the feedback loops assembly. In addition, it is no longer necessary to modify the elements of which the amplifier itself is composed, so that the performances of the amplifier, for which the amplifier has been optimized, are preserved.

In a variant of the invention, an amplification device as described hereinabove comprises a decoupling capacitor, which is placed upstream of the amplifier, and at least one first and one second feedback loop which are placed, respectively, between the output of the amplifier and first and second terminals of said decoupling capacitor.

In this variant of the invention, the decoupling capacitor serves to suppress the DC component of the signal to be amplified and enables to dissociate the first and second feedback loops, thereby facilitating a modification of their arrangement so that the value of the low cut-off frequency of the amplification device can be modified without a modification of the equivalent input impedance of the device.

In accordance with an advantageous embodiment of the invention, each feedback loop is composed of at least one first and one second switchable impedance, a selection of the first or the second impedance being effected by means of a first and a second switch, which are to be driven by, respectively, a first and a second control signal.

This embodiment enables a simple and flexible adjustment of the low cut-off frequency of the amplification device by programming the control signals. The number of possible values of the cut-off frequency is larger as the number of feedback loops and the number of switchable impedances forming said loops is larger.

In a particular embodiment of the invention, the impedance which is equivalent to a parallel array of the first impedances of the feedback loops is substantially equal to the impedance which is equivalent to a parallel array of the second impedances of said loops.

In accordance with a preferred embodiment of the invention, the switchable impedances are resistances.

Although the invention can be employed in every type of application where an amplification of an electronic signal is required, it can particularly advantageously be used in applications where data signals are to be amplified, which data signals originate from read heads of hard disks. The invention also relates to a read system including a read head, which is used to scan an information storage medium and generate electronic signals that are representative of said information, said system further including an amplification device as described hereinabove, for amplifying said signals.

BRIEF DESCRIPTION OF THE DRAWING

These and other aspects of the invention will be apparent from and elucidated with reference to the embodiment(s) described hereinafter.

In the drawings.

DESCRIPTION OF THE PREFERRED EMBODIMENTS

Figure 1:
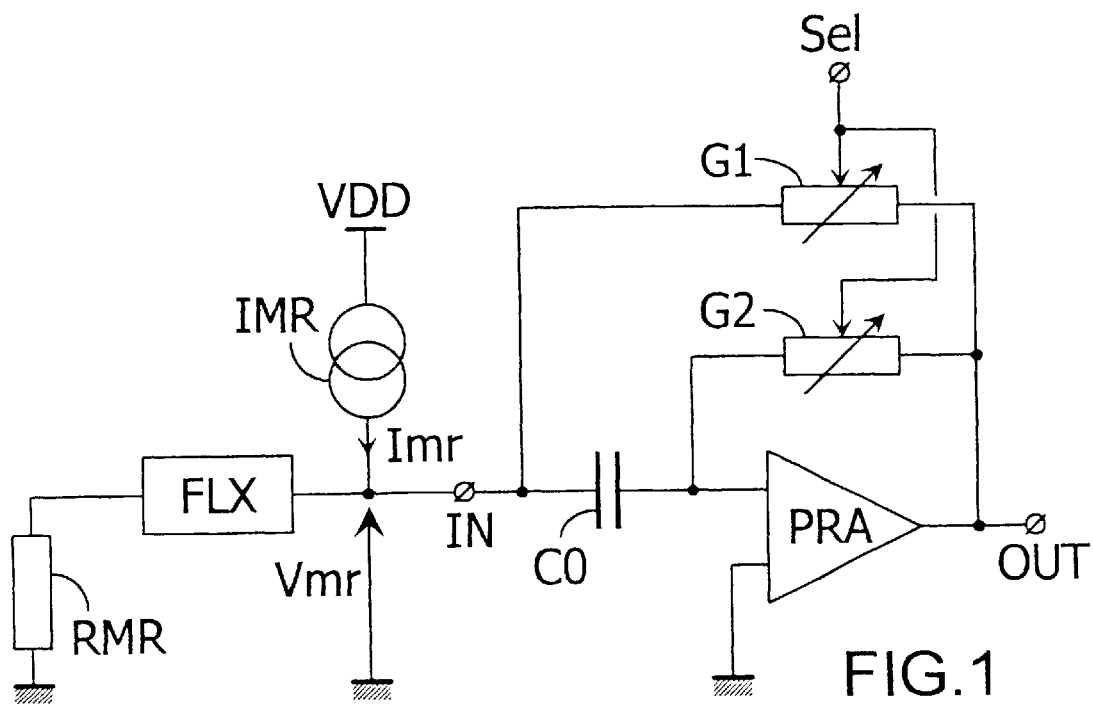
FIG. 1 shows a functional diagram describing an amplification device in accordance with the invention.

FIG. 1 diagrammatically shows a reading system comprising a read head, which is used to scan an information-storage medium and to generate electronic signals that are representative of said information, and an amplification device for amplifying said signals. The read head comprises a magneto-resistive rod RMR which is connected to an input IN of the amplification device via a flexible lead FLX. Said magneto-resistive rod RMR is polarized by means of a current source IMR which supplies a current Imr. The magneto-resistive rod RMR has a resistance Rmr which varies as a function of the magnetic field to which it is exposed. This rod RMR thus generates an electronic signal Vmr, the instantaneous value of which is equal to Rmr.Imr, if the losses caused by the flexible lead FLX are not taken into account, which electronic signal Vmr must be amplified by the amplification device.

The amplification device comprises, in this example, an amplifier PRA and a first and a second feedback loop G1 and G2. In other embodiments, it is possible to use a larger number of feedback loops, for performing positive and negative inverse feedback actions. The feedback loops G1 and G2 have adjustable gains, the value of which can be adjusted by programming the value of a selection signal Sel. This selection signal Sel can be provided in coded form on a plurality of bits, some of which will act on the first feedback loop, while others will act on the second feedback loop. In some applications, as will be described hereinbelow, it is possible to make all the bits of the selection signal act simultaneously on all the feedback loops.

The first and the second feedback loops G1 and G2 are arranged in such a way that they form an assembly having an equivalent impedance, which is substantially independent of the gain settings selected.

In the example described herein, the amplification device includes a decoupling capacitor CØ which is placed upstream of the amplifier PRA, the first and the second feedback loop G1 and G2 being placed, respectively, between the output of the amplifier and first and second terminals of said decoupling capacitor CØ.

The decoupling capacitor CØ serves to suppress the DC component of the signal Vmr to be amplified, and enables the first and second feedback loops G1 and G2 to be dissociated, thus facilitating a modification of their arrangement, so that the value of the low cut-off frequency of the amplification device can be modified without a modification of the equivalent input impedance of the device, which would disturb the impedance adaptation between said device and the flexible lead FLX.

Figure 2:
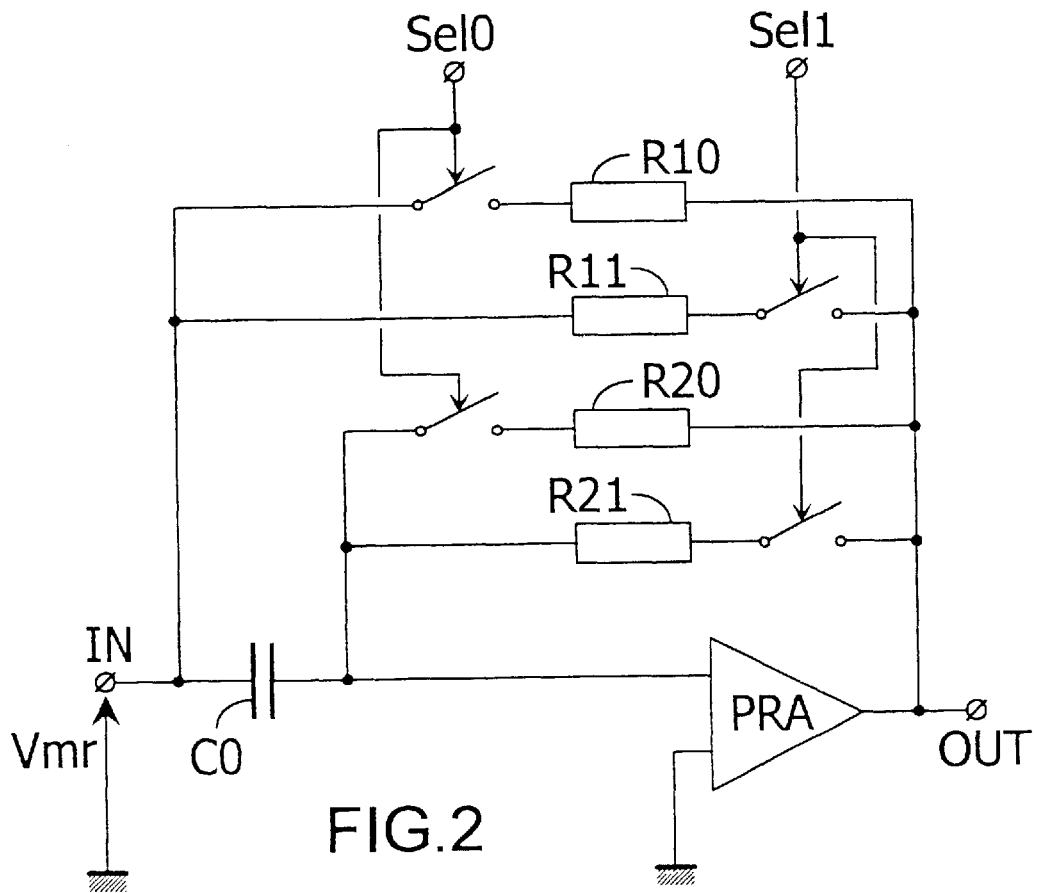
FIG. 2 shows a functional diagram describing an amplification device in accordance with a preferred embodiment of the invention.

FIG. 2 is a circuit diagram which represents an amplification device in accordance with a preferred embodiment of the invention. In this device, each feedback loop G1 and G2 consists of a first and a second switchable impedance (R10, R11) and (R20, R21), which are preferably resistances. A selection of the first or the second impedance is performed by means of a first and a second switch, which are driven by, respectively, a first and a second control signal Sel0 and Sel1, which are two bits of the selection signal Sel described hereinabove. This embodiment enables the user of the amplification device to select a low cut-off frequency value of said amplification device from two possible values. A larger number of feedback loops and of switchable impedances within each of said loops will, of course give access to a larger number of possible values. To achieve a same goal, optionally, use can be made of a larger number of selection signals in order to obtain a larger number of possible combinations of the different switchable impedances.

The switchable impedances are advantageously chosen to be such that the impedance which is equivalent to a parallel array of the first impedances (R10, R20) of the feedback loops is substantially equal to the impedance which is equivalent to a parallel array of the second impedances (R11, R21) of said loops, which can be expressed as follows: (R10//R20)=(R11//R21).

In another embodiment of the invention, it is possible to use only one impedance to implement one of the feedback loops, for example one impedance R1 to form the first feedback loop G1, the value of said impedance R1 being much smaller than the values of all the other switchable impedances. The equivalent impedance of the feedback loops assembly will thus be substantially equal to that of the first feedback loop and hence substantially independent of the settings of the other feedback loops.

What is claimed is:

1. A device for amplifying electronic signals, comprising:
   an amplifier having an input and an output, and
   a plurality of feedback loops placed between the output and the input of the amplifier, which feedback loops are arranged so that each feedback loop has an adjustable gain and all the feedback loops jointly form an assembly having an equivalent impedance, which is substantially independent of the selected gain settings.

2. An amplification device as claimed in claim 1, comprising a decoupling capacitor, which is placed upstream of the amplifier, and at least one first and one second feedback loop which are placed, respectively, between the output of the amplifier and first and second terminals of said decoupling capacitor.

3. An amplification device as claimed in claim 1, wherein each feedback loop is composed of at least one first and one second switchable impedance, a selection of the first or the second impedance being effected by means of a first and a second switch, which are to be driven by, respectively, a first and a second control signal.

4. An amplification device as claimed in claim 3, wherein the impedance which is equivalent to a parallel array of the first impedances of the feedback loops is substantially equal to the impedance which is equivalent to a parallel array of the second impedances of said loops.

5. An amplification device as claimed in claim 3, characterized in that the switchable impedances are resistances.

6. A read system comprising including a read head to scan an information storage medium and generate electronic signals that are representative of said information, said system further including an amplification device as claimed in claim 1 for amplifying said signals.

* * * * *

Disclaimer

6,392,478 B1 — Jan Mulder, Eindhoven (NL); Marcel Louis Lugthart, Eindhoven (NL). AMPLIFICATION DEVICE HAVING AN ADJUSTABLE BANDWIDTH. Patent dated May 21, 2002. Disclaimer filed March 28, 2008, by the assignee, U.S. Philips Corporation.

Hereby enters this disclaimer to all claims of said patent.

*(Official Gazette, April 7, 2009)*